(12) United States Patent
Leonard et al.

(10) Patent No.: US 7,075,797 B1
(45) Date of Patent: Jul. 11, 2006

(54) CIRCUIT BOARD RISER FOR VOLUME SHARING PERIPHERAL CARDS

(75) Inventors: Brian Hargrove Leonard, Durham, NC (US); Michael Thano Matthews, Cary, NC (US); Susan Sommers Moffatt, Chapel Hill, NC (US); John David Swansey, Durham, NC (US)

(73) Assignee: Lenovo (Singapore) Pte Ltd., Lorong Chuan (SG)

( * ) Notice: Subject to any disclaimer, the term of this patent is extended or adjusted under 35 U.S.C. 154(b) by 0 days.

(21) Appl. No.: 11/152,137

(22) Filed: Jun. 14, 2005

(51) Int. Cl.
*H05K 1/18* (2006.01)
*H05K 7/10* (2006.01)
*H01R 12/18* (2006.01)

(52) U.S. Cl. .................. 361/803; 361/796; 361/785; 439/59

(58) Field of Classification Search ............ 361/788, 361/796, 785, 797, 798, 803; 439/59–62, 439/654
See application file for complete search history.

(56) References Cited

U.S. PATENT DOCUMENTS

| | | | |
|---|---|---|---|
| 4,885,482 A * | 12/1989 | Sharp et al. ............. 326/47 |
| 5,754,796 A * | 5/1998 | Wang et al. ............. 710/301 |
| 5,926,378 A | 7/1999 | DeWitt et al. ........... 361/788 |
| 6,146,150 A * | 11/2000 | Roberts .................. 439/55 |
| 6,147,871 A | 11/2000 | DeWitt et al. ........... 361/752 |
| 6,155,842 A * | 12/2000 | Baitz .................... 439/61 |
| 6,477,603 B1 | 11/2002 | Locker et al. ........... 710/301 |
| 6,491,526 B1 * | 12/2002 | Leman .................. 439/61 |
| 6,504,725 B1 * | 1/2003 | Lam .................... 361/785 |
| 6,533,587 B1 * | 3/2003 | Potter et al. ............ 439/65 |
| 6,731,515 B1 * | 5/2004 | Rhoads .................. 361/796 |
| 6,749,439 B1 * | 6/2004 | Potter et al. ............ 439/65 |
| 6,789,148 B1 * | 9/2004 | Hinds .................. 710/300 |
| 2003/0049948 A1 * | 3/2003 | Kim et al. .............. 439/61 |

OTHER PUBLICATIONS

Ajay V. Bhatt, Technology and Research Labs, Intel Corporation, "Creating a Third Generation I/O Interconnect," Copyright 2002, pp. 1-8.

* cited by examiner

*Primary Examiner*—Kamand Cuneo
*Assistant Examiner*—Dameon E. Levi
(74) *Attorney, Agent, or Firm*—Henry L. Ehrlich; Winstead Sechrest & Minick P.C.

(57) ABSTRACT

A substantially rigid card having a first side and an opposing second side, a first connector end adapted to mate with a first expansion connector on a circuit board and a second connector end adapted to mate with a second expansion connector on the board. A first peripheral card connector is connected to the first side and electrically connected to the first connector end, wherein the first connector is of a first form factor and adapted to mate with a first peripheral card. A second peripheral card connector is connected to the second side and electrically connected to the second connector end, wherein the second connector is of a second form factor different from the first form factor and matable with a second peripheral card. The first peripheral card connector is spaced from the first connector end a distance approximately the same as the distance the second peripheral card connector is spaced from the second connector end such that the peripheral card carried by the riser card shares approximately the same region whether the riser card is in a first or a second orientation.

14 Claims, 4 Drawing Sheets

CIRCUIT BOARD RISER FOR VOLUME SHARING PERIPHERAL CARDS

TECHNICAL FIELD

The present invention relates to the field of data processing systems, and more particularly to riser cards for connecting peripheral cards to circuit boards in a volume sharing manner.

BACKGROUND INFORMATION

Increased packaging densities in current computer assemblies in conjunction with increased market demand for lower profile computer systems has resulted in a tradeoff between space and accommodation of multiple peripheral cards. Small form factor personal computers have little room for expansion slots. Typically, a choice is made to provide only one expansion slot such as a PCI or graphics slot.

Therefore, there is a need in the art to provide a system that allows a small form factor chassis to accommodate either a PCI or a graphics peripheral card without omitting the other.

SUMMARY

Accordingly, a riser card for data processing systems is provided the riser card including a substantially rigid card having a first side and an opposing second side, a first connector end adapted to mate with a first expansion connector on a circuit board and a second connector end adapted to mate with a second expansion connector on the board. A first peripheral card connector is connected to the first side and electrically connected to the first connector end, wherein the first connector is of a first form factor and adapted to mate with a first peripheral card. A second peripheral card connector is connected to the second side and electrically connected to the second connector end, wherein the second connector is of a second form factor different from the first form factor and matable with a second peripheral card.

The first and second connectors may be of the same form factor. However, one connector is adapted for connecting a low profile card and the other connector is adapted for connecting a full-height card.

The first peripheral card connector is spaced from the first connector end a distance approximately the same as the distance the second peripheral card connector is spaced from the second connector end such that the peripheral card carried by the riser card shares approximately the same region whether the riser card is in a first or a second orientation.

The foregoing has outlined rather generally the features and technical advantages of one or more embodiments of the present invention in order that the detailed description of the invention that follows may be better understood. Additional features and advantages of the invention will be described hereinafter which may form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
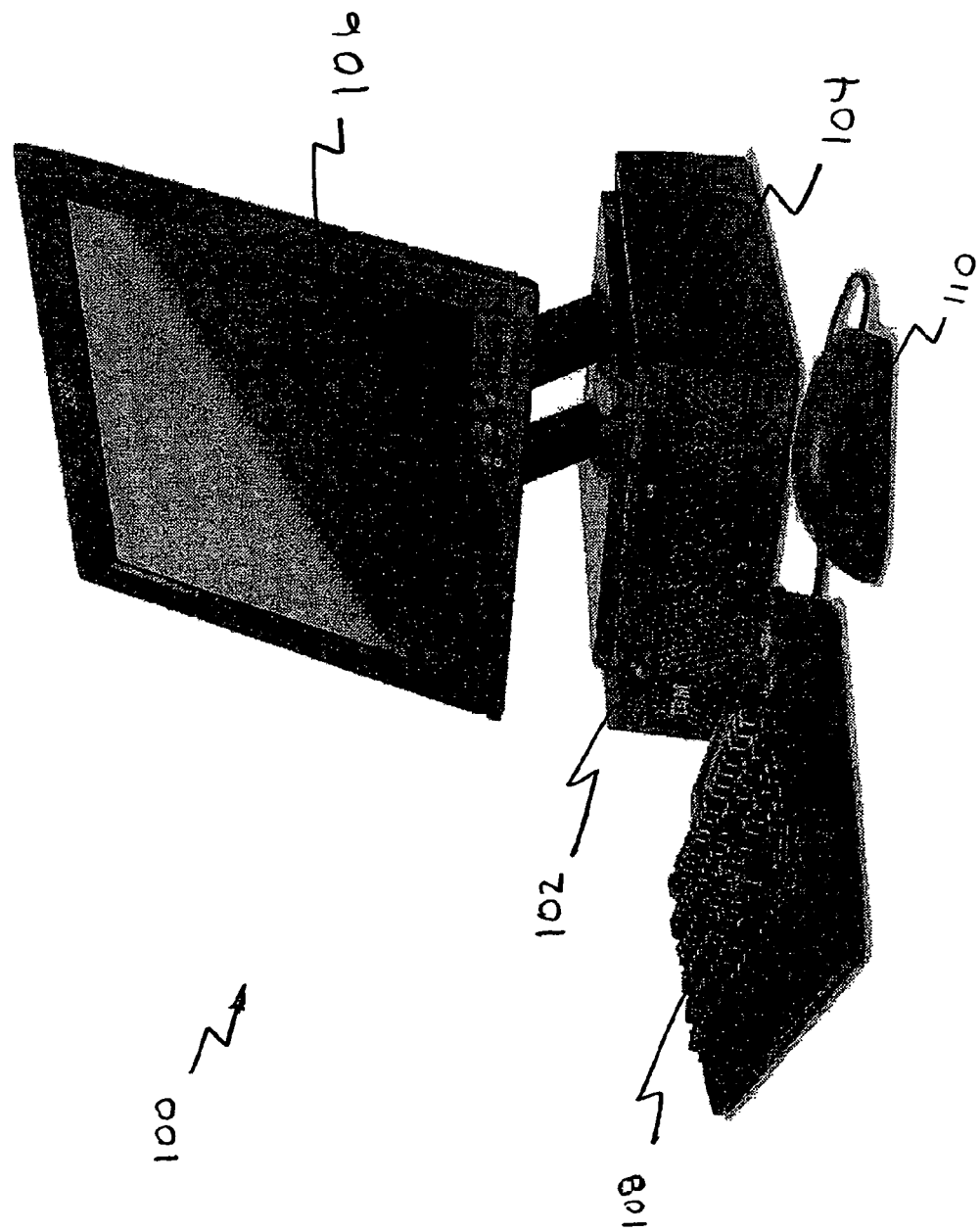
FIG. 1 is an illustration of a small form factor personal computer system in accordance with an embodiment of the present invention.

Refer now to the drawings wherein depicted elements are not necessarily shown to scale and wherein like or similar elements are designated by the same reference numeral through the several views.

FIG. 1 illustrates an embodiment of the present invention of a small form factor personal computer system 100. System 100 may include a processor 102, a drive 104, a display 106, a keyboard 108, and a mouse 110. Incorporated within processor 102 is a circuit board and one or more peripheral cards, assembled according to the present invention to provide a small form factor unit. As is well known, the peripheral cards communicate with the computer system over one or more Input/Output buses, where such buses comply with specified Input/Output protocols. Each bus standard also specifies a physical form factor which defines among other things, a corresponding size, shape and contact spacing. Such I/O protocols and form factors may be specified by standard specifications such as those relating to Peripheral Component Interconnect (PCI), AGP, ISA, PCL SCSL or Micro Channel. The specification for each bus form factor allows peripheral card manufacturers to produce cards which could attach to corresponding peripheral card connectors of the computer system. Although a small form factor model is illustrated the present invention is equally applicable to stand-up models, web server applications, rack mount, and all-in-one PC models.

Figure 2:
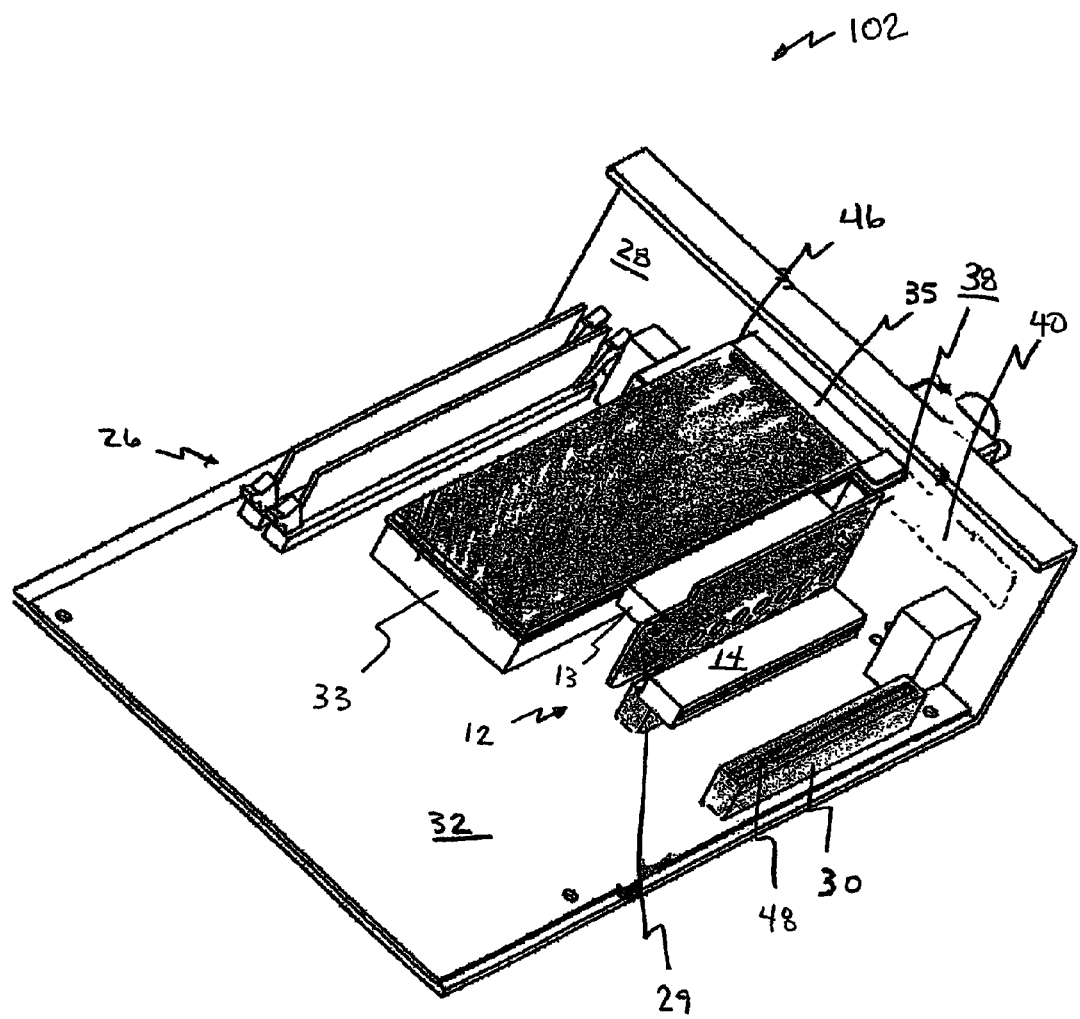
FIG. 2 is a perspective, cut-away view of a small form factor processor system of the present invention.

FIG. 2 is a perspective view of a small form factor processor system 102 of the present invention with a riser card 12 installed in a first orientation, i.e. oriented for a low profile card. Riser card 12 is installed in a first riser card connector 29, typically a standard option card connector, in electrical and functional connection with a circuit board 32. A low profile graphics card 33 is installed in the first card connector 13 of riser card 12. A second riser card connector 30 is adapted for installing riser card 12 in the second orientation with a full height card 34 installed, see FIG. 5.

Second riser card connector 30 is connected to motherboard 32 in a spaced relation to first riser card connector 29 in a manner such that, when riser card 12 is in the first orientation the low profile card bracket 35 is aligned with the full-length slot 38 in the rear wall 28 of chassis 26, and when riser card 12 is in the second orientation the full height bracket 36 (FIG. 5) is aligned with full-length slot 38. When riser card 12 is in the first orientation, a plug 40 may be connected cover the portion of full-length slot 38 not covered by a card and/or card bracket.

Figure 3:
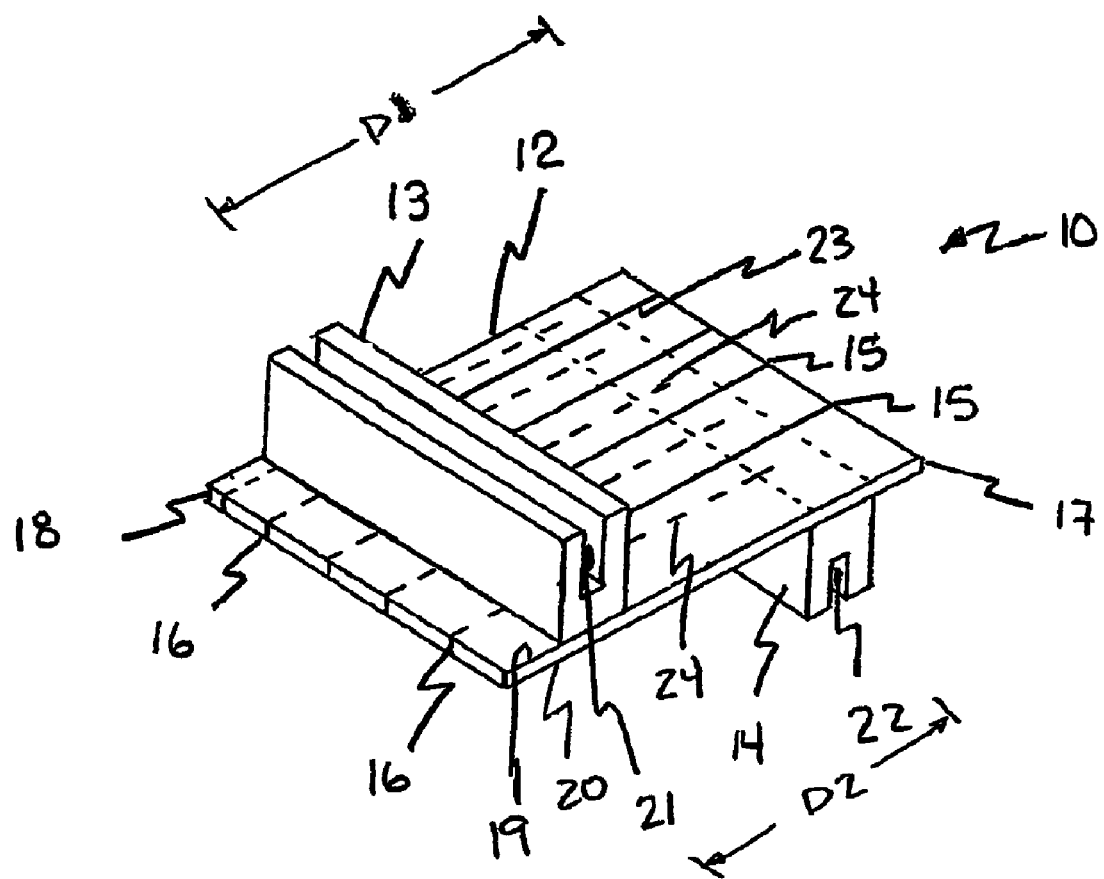
FIG. 3 is a perspective view of an embodiment of the circuit board riser card of the present invention.

FIG. 3 is a perspective view of an embodiment of the circuit board riser card assembly, generally denoted by the numeral 10, of the present invention. Circuit board riser card assembly 10 includes a riser card 12 and at least a pair of peripheral card connectors 13 and 14.

Riser card 12 includes a first set of electrical contacts 15 formed at its first connecting end 17. First peripheral card connector 13 is mounted on a first side 19 of riser card 12.

Figure 4:
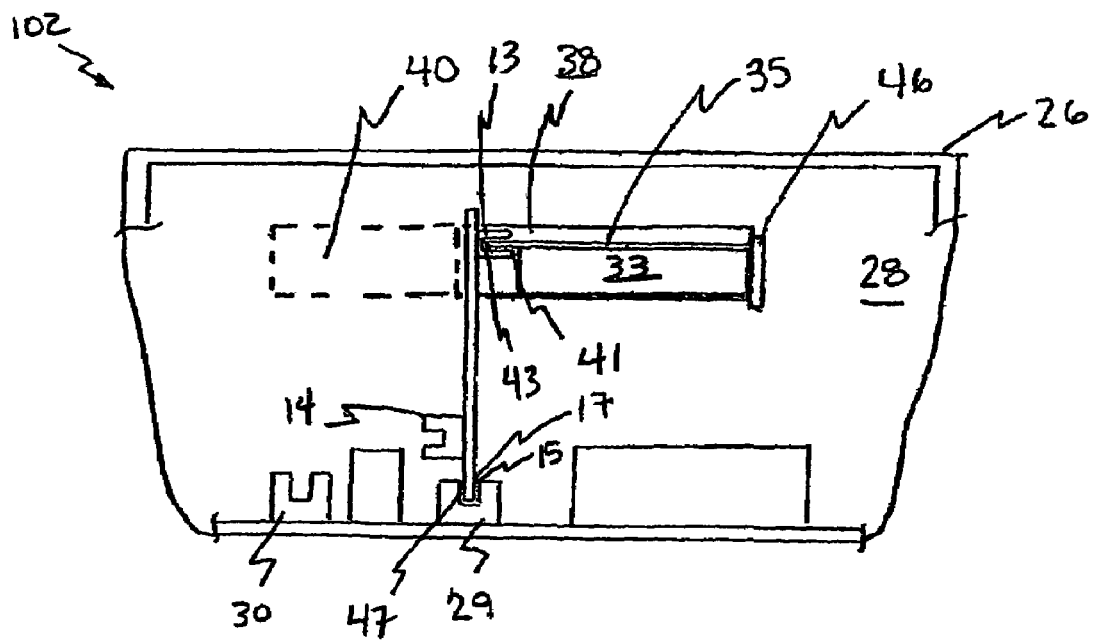
FIG. 4 is a cut-away view of a small form factor processor system of the present invention with the riser card oriented for a low profile card installation.

First card connector 13 includes electrical contacts 21 for providing electrical connection to corresponding contacts 43 of the first peripheral card 33 (FIG. 4).

Figure 5:
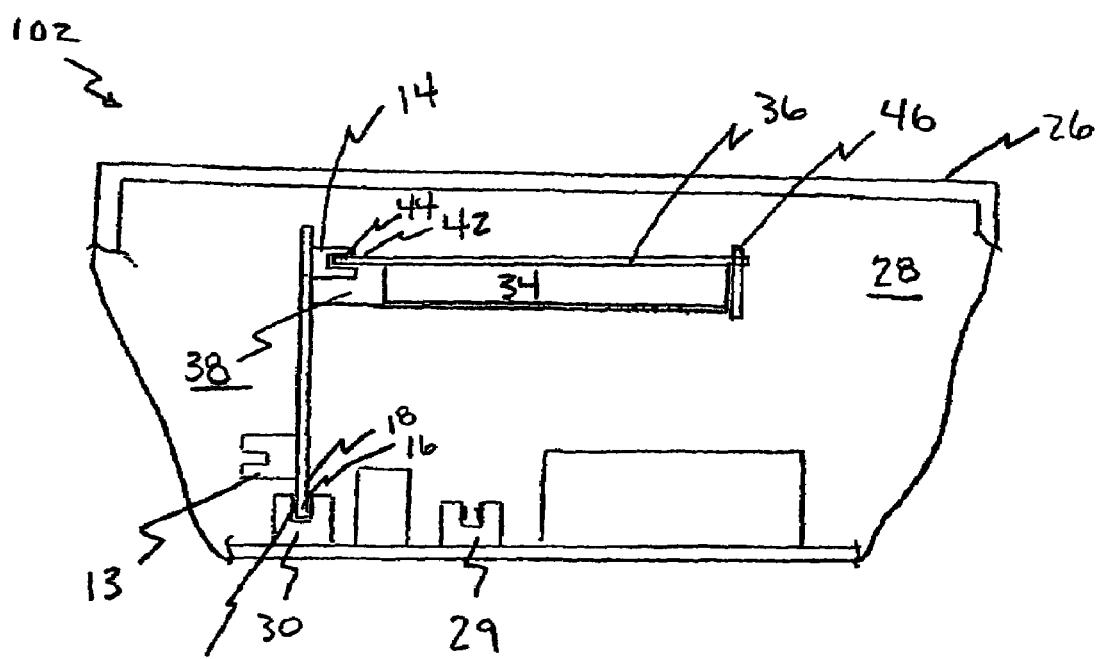
FIG. 5 is cut-away view of an embodiment of the small form factor processor system of the present invention with the riser card oriented for a full size card installation.

Riser card 12 includes a second set of electrical contacts 16 formed at its second connecting end 18. Second peripheral card connector 14 is mounted on the opposing second side 20 of riser card 12 from first peripheral card connector 13. Second card connector 14 includes electrical contacts 22 for providing electrical connection to corresponding contacts 44 of the second peripheral card 34 (FIG. 5).

Riser card 12 may be fabricated from an epoxy glass composite or any other suitable material with electrically conductive metallic circuit traces 23 and 24. The circuit traces are disposed on the riser card for electrically connecting the circuitry of the peripheral cards to the circuitry disposed on the circuit board. Circuit trace 23 electrically connects contacts 21 of first card connector 13 with electrical contacts 15 of first connecting end 17. Circuit trace 24 electrically connects contacts 22 of second card connector 14 with electrical contacts 16 of second connecting end 18.

Peripheral card connectors 13, 14 may be provided in a variety of arrangements. For example, the peripheral card connectors 13, 14 may be integrated into a single solid piece, such as a molded piece, allowing them to extend outwardly from the opposing sides of riser card 12 in accordance of the present invention. Other suitable fastening means, such as, but not limited to, soldering, screws and corresponding nuts, rivets, and bonding adhesives may be used in lieu of the illustrated connections to riser card 12.

Electrical contacts 21 of connector 13 are positioned and spaced in accordance with a first bus form factor. Electrical contacts 22 of connector 14 are positioned and spaced in accordance with a second bus form factor different from the first bus form factor. For example, in this embodiment of the invention first card connector 13 is disposed in accordance with a PCI express form factor and second card connector 14 is disposed in accordance with a PCI form factor. The differing form factors may include, but are not limited to, PCI, PCI express, ISA, Micro Channel, etc.

First peripheral card connector 13 is spaced a distance D1 from first connector end 17. Second card connector 14 is spaced a distance D2 from second connector end 18 approximately the same distance that first card connector 13 is spaced from first connector end 17. In this manner, the peripheral cards share substantially the same region when riser card 12 is in either the first orientation (FIG. 4) or in the second orientation (FIG. 5).

FIG. 4 is a cut-away view of an embodiment of small form factor processor system 102 of the present invention with riser card 12 in the first, or low profile card, orientation. A low profile PCI express 16 lane graphics card 33, having a connecting end 41 with contacts 43, is installed in first card connector 13 of riser card 12. Low profile card 33 is of the same form factor as first card connector 13. Contacts 43 of first card 33 provide electrical connection to corresponding contacts 21 of first card connector 13 (FIG. 3).

First riser card connecting end 17 is installed in first riser card connector 29. Contacts 15 of first riser card connecting end 17 provide electrical connection with contacts 47 of first riser card connector 29. First card connector 13 and first riser card connector 29 are of the same form factor.

Low profile bracket 35 is accommodated by full-length modular slot 38. A bracket tab 46 is positioned proximate modular slot 38 for connection with low profile bracket 35. Plug 40 is disposed over the portion of modular slot 38 extending beyond low profile bracket 35. In the first orientation, peripheral card 33 occupies or is positioned within a certain region, in this embodiment that region is proximate modular slot 38.

FIG. 5 is a cut-away view of an embodiment of the small form factor processor system 102 of the present invention with riser card 12 in the second, or full height card, orientation. A full height PCI card 34, having a connecting end 42 with contacts 44, is installed in second card connector 14 of riser card 12. Full height card 34 is the same form factor as second card connector 14. Contacts 44 of second card 34 provide electrical connection to corresponding contacts 22 of second card connector 14 (FIG. 3).

Second riser card connecting end 18 is installed in the second riser card connector 30. Contacts 16 of second riser card connecting end 18 provide electrical connection with contacts 48 of second riser card connector 30. Second card connector 14 and second riser card connector 30 are of the same form factor.

Full height bracket 36 is accommodated by full-length modular slot 38. Full height bracket 36 is connectable to bracket tab 46 positioned proximate modular slot 38. In the full height orientation, plug 40 (FIGS. 2 and 4) is removed from modular slot 38. In the second orientation, peripheral card 34 shares the same region occupied peripheral card 33 in the first orientation. In this embodiment, the region is proximate modular slot 38. It should be apparent by the description that by sharing the same region, one card may occupy more or less of the total volume of the region than occupied by the other card.

Operation of the small form factor system of the present invention is described with reference to FIGS. 1 through 5. A small form factor processor 102 is provided having a first graphics expansion slot 29 and a second PCI slot 30 connected to motherboard 32 in a spaced relationship to one another. First slot 29 and second slot 30 are spaced in relation to each other such that when riser card 12 is in the first orientation carrying a low profile graphics card 33 or in the second orientation carrying a full-height card 34, the same region in the system is utilized, or shared.

When riser card 12 is in the first orientation, the low profile card bracket 35 is aligned with a full-height slot 38 formed in chassis 26. A plug 40 is provided for covering a portion of slot 38 extending beyond low profile card bracket 35. Second riser card connector slot 30 is connected to motherboard 32 in a position such that when riser card 12 is in the second orientation carrying a full-height card 34, the full-height card bracket 36 is aligned with full-height slot 38 formed in chassis 26. A bracket tab 46 is provided for connecting with either low profile bracket 35 or full-height bracket 36.

To install a low-profile graphics card 33 in processor 102, a low-profile card 33 is connected to first card connector 13. First connecting end 17 of riser card 12 is installed in first expansion slot 29. Low-profile card bracket 35 connected with bracket tab 46 and aligned with full-height slot 38. A plug 40 may be placed in covering position over the portion of full-height slot 38 extending beyond low-profile card bracket 35.

To install a full-height PCI card 34 in processor 102, plug 40 is removed from covering position in full-height slot 38. Riser card 12 is removed from connection with first card expansion slot 29. Low-profile card 33 is removed from first card connector 13. Full-height PCI card 34 is connected with second card connector 14 of riser card 12. Riser card 12 is rotated 180 degrees from the first, low-profile, orientation and second connecting end 18 is installed in second expansion slot 30. Full-height card bracket 36 is aligned with full-height slot 38 of chassis 26 and is attached to bracket tab 46.

As can be seen a small form factor system has been provided for selectively accommodating a choice of cards having differing form factors and sizes without sacrificing space limitations or air passage. For example, as demonstrated in the various Figures, a small form chassis may accommodate a full-height PCI card or accommodate a low-profile graphics card on the same chassis, in the same region, without enlarging the case.

Although the system and method are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

The invention claimed is:

1. A riser card comprising:
   a substantially rigid card having a first side and an opposing second side, a first connector end adapted to mate with a first expansion connector on a circuit board and a second connector end adapted to mate with a second expansion connector on the board;
   a first peripheral card connector connected to the first side and electrically connected to the first connector end, wherein the first connector is of a first form factor and matable with a first peripheral card; and
   a second peripheral card connector connected to the second side and electrically connected to the second connector end, wherein the second connector is of a second form factor different from the first form factor and matable with a second peripheral card;
   wherein the first peripheral card connector is spaced a distance from the first connector end and the second peripheral card is spaced a distance from the second end substantial equal to the distance the first peripheral card is spaced from the first connector end.

2. The riser card of claim 1, wherein the first form factor is for a low profile PCI express 16 lane graphics card.

3. The riser card of claim 1, wherein the first form factor is for a full height PCI card.

4. The riser card of claim 1, wherein:
   the first form factor is for a low profile PCI express 16 lane graphics card; and
   the second form factor is for a full height PCI card.

5. The riser card of claim 1, wherein the first peripheral card is a low profile peripheral card.

6. The riser card of claim 1, wherein the first peripheral card is a full height peripheral card.

7. The riser card of claim 1, wherein:
   the first peripheral card is a low profile peripheral card; and
   the second peripheral card is a full height peripheral card.

8. A riser card assembly, the assembly comprising:
   a first expansion connector of a first form factor connectable to a circuit board;
   a second expansion connector of a second form factor connectable to the circuit board;
   a substantially rigid card having a first side and an opposing second side, a first connector end adapted to mate with the first expansion connector and a second connector end adapted to mate with the second expansion connector;
   a first peripheral card connector connected to the first side and electrically connected to the first connector end, wherein the first connector is of the first form factor and adapted to mate with a first peripheral card; and
   a second peripheral card connector connected to the second side and electrically connected to the second connector end, wherein the second connector is of the second form factor and adapted to mate with a second peripheral card;
   wherein the first peripheral card connector is spaced a distance from the first connector end and the second peripheral card is spaced a distance from the second end substantial equal to the distance the first peripheral card is spaced from the first connector end.

9. The assembly of claim 8, wherein:
   the first form factor is for a low profile PCI express graphics card; and
   the second form factor is for a full height PCI card.

10. The assembly of claim 8, further including:
    a low profile PCI express graphics card matable with the first peripheral card connector; and
    a full height PCI card matable with the second peripheral card connector.

11. The assembly of claim 8, further including a plug connectable within a portion of a modular slot formed through a wall of a chassis that is not filled by the low profile PCI express graphics card.

12. A data processing system, the system comprising:
    a chassis having a wall forming a modular slot;
    a circuit board carried by the chassis;
    a first expansion connector of a first form factor connected to the circuit board; and
    a second expansion connector of a second form factor connected to the circuit board;
    wherein the first expansion connector and the second expansion are connected to the circuit board in a spaced relationship such that when a riser card is connected to the first expansion connector in a first orientation, a first peripheral card of the first form factor is positioned adjacent the modular slot and when the riser card is connected to the second expansion connector in a second orientation, a second peripheral card of the second form factor is positioned adjacent the modular slot.

13. The system of claim 12, wherein:
    the first form factor is for a low profile graphics card; and
    the second form factor of for a full height card.

14. The system of claim 12, further including a riser card comprising:
    a substantially rigid card having a first side and an opposing second side, a first connector end adapted to mate with the first expansion connector and a second connector end adapted to connect with the second expansion connector;
    a first peripheral card connector connected to the first side and electrically connected to the first connector end, wherein the first connector is of the first form factor and matable with a first peripheral card; and
    a second peripheral card connector connected to the second side a and electrically connected to the second connector end, wherein the second connector is of the second form factor and matable with a second peripheral card.

* * * * *